(12) United States Patent
Tanaka (10) Patent No.: US 9,136,296 B2
(45) Date of Patent: Sep. 15, 2015

(54) PHOTOELECTRIC CONVERSION APPARATUS AND RADIOGRAPHIC IMAGING APPARATUS

(75) Inventor: Tsutomu Tanaka, Kanagawa (JP)

(73) Assignee: SONY CORPORATION (JP)

( * ) Notice: Subject to any disclaimer, the term of this patent is extended or adjusted under 35 U.S.C. 154(b) by 896 days.

(21) Appl. No.: 12/821,781

(22) Filed: Jun. 23, 2010

(65) Prior Publication Data

US 2011/0001051 A1    Jan. 6, 2011

(30) Foreign Application Priority Data

Jul. 3, 2009   (JP) .............................. P2009-158353

(51) Int. Cl.
*H01L 31/105*   (2006.01)
*G01T 1/24*    (2006.01)
(Continued)

(52) U.S. Cl.
CPC ............ *H01L 27/14632* (2013.01); *G01T 1/24* (2013.01); *H01L 25/167* (2013.01); *H01L 27/146* (2013.01); *H01L 27/14623* (2013.01); *H01L 27/14643* (2013.01); *H01L 27/14658* (2013.01); *H01L 27/14663* (2013.01); *H01L 31/105* (2013.01); *H01L 27/14687* (2013.01)

(58) Field of Classification Search
CPC ......... G01T 1/2018; G01T 1/24; G01T 1/241; G21K 4/00; G21K 2004/04; H01L 31/105; H01L 31/1055; H01L 27/1463; H01L 27/14636; H01L 27/14643; H01L 27/14658; H01L 27/14659; H01L 27/04663; H01L 27/14665; H01L 27/14676; H01L 27/14692; H01L 25/167; H01L 29/868; H01L 33/0012; H01L 51/4293

USPC ............ 250/370.01, 370.08, 370.09, 370.14, 250/214.1, 370.11; 257/443, 458, 465, 466, 257/257, 258, 292–294, E31.087, E31.088, 257/E31.091, E31.092, 290, 291, 656, 257/E29.336, E27.127, E27.13, E27.133, 257/E27.136, E27.14, E27.143, E27.146

See application file for complete search history.

(56) References Cited

U.S. PATENT DOCUMENTS 4,847,210 A * 7/1989 Hwang et al. ................... 438/59
4,885,622 A * 12/1989 Uchiyama et al. ............... 257/53
5,079,426 A * 1/1992 Antonuk et al. .......... 250/370.09
(Continued)

FOREIGN PATENT DOCUMENTS

EP    1113499    7/2001
EP    1420453    5/2004
(Continued)

OTHER PUBLICATIONS

European Patent Office, Partial European Search Report, issued in connection with European Patent Application No. 10006554.9, dated Mar. 26, 2012. (7 pages).

(Continued)

*Primary Examiner* — Michael G Lee
*Assistant Examiner* — Suezu Ellis
(74) *Attorney, Agent, or Firm* — Sheridan Ross P.C.

(57) ABSTRACT

A photodiode includes a first semiconductor layer having a first conductivity type, a second semiconductor layer having a second conductivity type that is opposite to the first conductivity type of the first semiconductor layer, and a third semiconductor layer interposed between the first semiconductor layer and the second semiconductor layer. An edge of the first semiconductor layer is inset from an edge of the second semiconductor layer.

33 Claims, 9 Drawing Sheets

(51) Int. Cl.
*H01L 27/146* (2006.01)
*H01L 25/16* (2006.01)

(56) References Cited

U.S. PATENT DOCUMENTS

| | | | |
|---|---|---|---|
| 5,587,611 A * | 12/1996 | Botka et al. | 257/458 |
| 6,020,590 A * | 2/2000 | Aggas et al. | 250/370.09 |
| 6,163,030 A * | 12/2000 | Johnson et al. | 250/370.14 |
| 6,288,435 B1 * | 9/2001 | Mei et al. | 257/458 |
| 6,600,160 B2 | 7/2003 | Kobayashi et al. | |
| 6,989,540 B2 * | 1/2006 | Morii et al. | 250/370.11 |
| 7,157,686 B2 * | 1/2007 | Shiu | 250/214.1 |
| 7,569,832 B2 * | 8/2009 | Tredwell et al. | 250/370.11 |
| 7,622,785 B2 * | 11/2009 | Sasagawa et al. | 257/432 |
| 8,174,087 B2 * | 5/2012 | Okada | 257/443 |
| 8,274,057 B2 * | 9/2012 | Okada | 250/370.09 |
| 2006/0001120 A1 | 1/2006 | Wright | |
| 2007/0007458 A1 | 1/2007 | Mochizuki et al. | |
| 2007/0040099 A1 * | 2/2007 | Yokoyama et al. | 250/208.1 |
| 2012/0038018 A1 * | 2/2012 | Yamada et al. | 257/458 |
| 2012/0299070 A1 * | 11/2012 | Yamada et al. | 257/291 |

FOREIGN PATENT DOCUMENTS

| | | |
|---|---|---|
| JP | H02-159772 | 6/1990 |
| JP | 03-185868 | 8/1991 |
| JP | 11-307756 | 11/1999 |
| JP | 2001-250935 | 9/2001 |

OTHER PUBLICATIONS

European Patent Office, European Search Report, issued in connection with European Patent Application No. 10006554.9, dated Jul. 11, 2012. (10 pages).

Official Action (no English translation available) for Japanese Patent Application No. 2009158353 mailed Sep. 24, 2013, 4 pages.

* cited by examiner

PRIOR ART

PHOTOELECTRIC CONVERSION APPARATUS AND RADIOGRAPHIC IMAGING APPARATUS

CROSS REFERENCES TO RELATED APPLICATIONS

The present application claims priority to Japanese Priority Patent Application JP 2009-158353 filed on Jul. 3, 2009, the entire content of which is hereby incorporated by reference.

BACKGROUND

The present disclosure relates to a photoelectric conversion apparatus and a radiographic imaging apparatus, and particularly to a radiographic imaging apparatus or radiographic reading apparatus which wavelength converts radioactive rays represented by α-rays, β-rays, γ-rays and X-rays into rays in a sensitive range of a photoelectric conversion apparatus with a wavelength conversion member to read information based on the radioactive rays.

In a photoelectric conversion apparatus and a radiographic imaging apparatus, charge produced by photoelectric conversion by a photoelectric conversion section based on input information is transferred to an external capacitor, by which the charge is converted into a signal voltage. By transferring the charge from the capacitor of the photoelectric conversion section itself to the external capacitor to convert the charge into a signal voltage in this manner, a comparatively high S/N ratio can be obtained.

Incidentally, where a configuration is applied wherein a plurality of pixels are arranged in a juxtaposed relationship with each other, the wiring line length of a signal line for reading out a signal from a pixel becomes great in accordance with the number of the pixels, and parasitic capacitance is sometimes formed. For example, it is assumed that a great number of pixels individually having the size of 200 μm×200 μm are arranged in a matrix of 2,000 pixels in the vertical direction×2,000 pixels in the horizontal direction to produce an area sensor having a size equal to that of an X-ray film, for example, the size of 40 cm×40 cm.

Where an area sensor has a size equal to that of an X-ray film, capacitance is formed by an overlap of the source region and the gate electrode of a transistor for charge transfer. Since a number of overlaps equal to the number of pixels are formed, even if the overlap capacitance Cgs is approximately 0.05 pF per one place, a capacitance of 0.05 pF×2,000=100 pF is formed on one signal line.

Since the capacitance Cs of the photoelectric conversion section itself, that is, the sensor capacitance, is approximately 1 pF, where a signal voltage generated in a pixel is represented by V1, the output voltage V0 of a signal line is given by $$V0=\{Cs/(Cs+Cgs\times 1000)\}\times V1$$

and the output voltage becomes approximately 1/100. In other words, the output voltage drastically decreases where an area sensor having a great area is configured.

Further, in order to carry out reading of a dynamic picture image in such a situation as described above, a sensitivity and a high-speed performance of operation with which image reading of 30 or more images per one second are required. Particularly, also it is demanded to minimize the dose of X-rays to be irradiated in a non-destructive inspection including X-ray diagnosis in the medical care, and it is demanded to further enhance the sensitivity such that the signal charge amount can be increased to 100 to 400 times.

On the other hand, a photoelectric conversion apparatus which is configured such that a source follower circuit is provided for each pixel is known and disclosed, for example, in Japanese Patent Laid-Open No. Hei 11-307756 (refer, particularly to paragraphs 0040 to 0044 and FIG. 7, hereinafter referred to as Patent Document 1). The source follower circuit includes a field-effect transistor for receiving signal charge generated by a photoelectric conversion section at the gate thereof to read out a signal voltage corresponding to the signal charge into a signal line. The source follower circuit makes it possible to read out a signal at a high speed also where the capacitance formed on the signal line is high.

Figure 10:
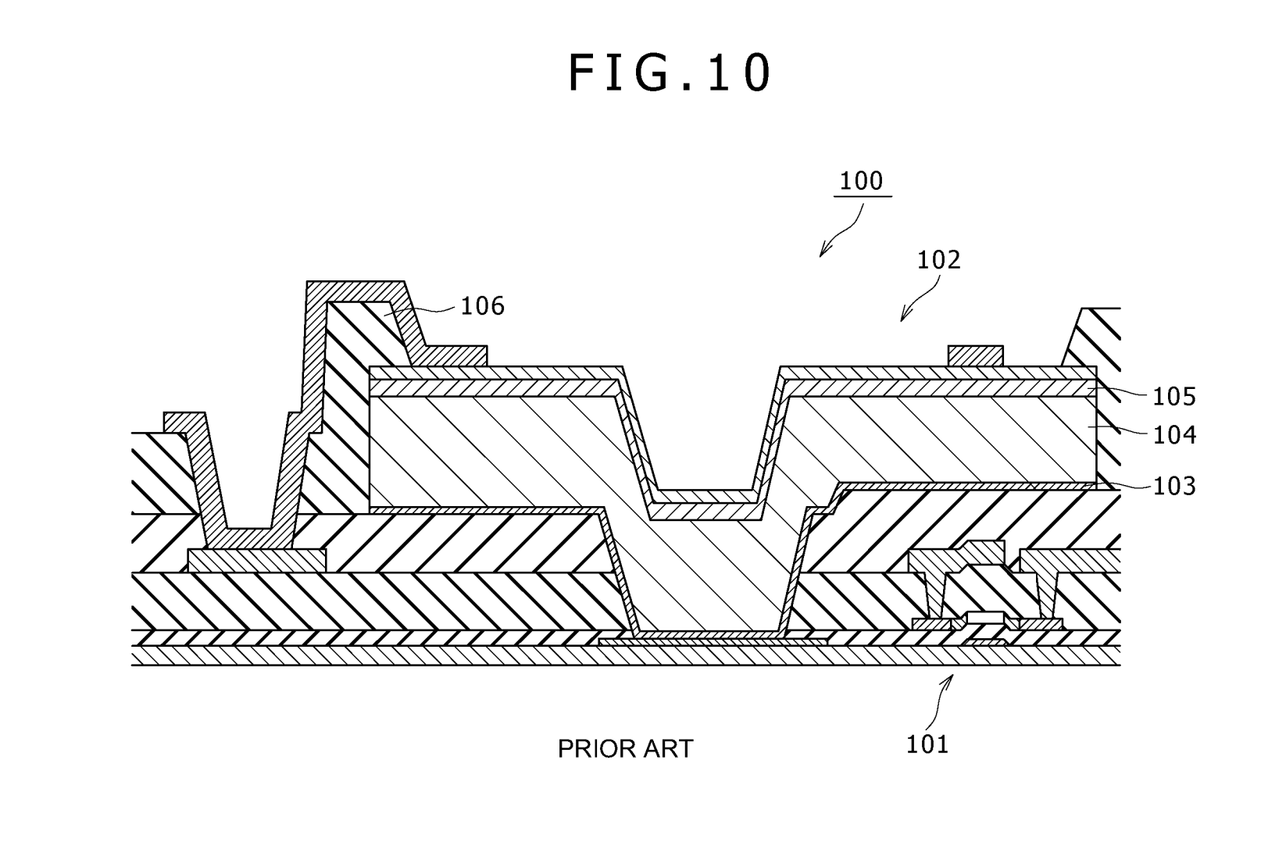
FIG. 10 is a sectional view showing a pixel structure in related art.

An example of a pixel structure in related art is shown in FIG. 10. Referring to FIG. 10, a pixel 100 shown includes a driving device section including a transistor 101 having a bottom gate structure and a PIN (Positive Intrinsic Negative Diode) photodiode 102. The PIN photodiode 102 has a structure wherein an n-type semiconductor layer 103, an i-type semiconductor layer 104 and a p-type semiconductor layer 105 are laminated in order and patterned into a substantially same shape. The i-type semiconductor layer 104 is formed with a thickness of approximately 1 μm, for example, from amorphous silicon.

The photoelectric conversion apparatus disclosed in Patent Document 1 is structured such that the n-type semiconductor layer 103 and the p-type semiconductor layer 105 have a substantially same shape. Therefore, the edge portions of the both semiconductor layers 103 and 105 are disposed very closely to each other sandwiching the i-type semiconductor layer 104 having a thickness of at most approximately 1 μm therebetween. Therefore, leakage current is likely to be generated between the edges of the n-type semiconductor layer 103 and the p-type semiconductor layer 105 on the interface of them with an inter-layer insulating film 106.

The photoelectric conversion apparatus in related art has a problem that, since a photoelectric conversion device in which leakage current is generated, for example, the PIN photodiode 102, is disabled to normally accumulate photoelectrically converted charge, the photoelectric conversion device becomes a defective device. Even if the photoelectric conversion device does not become a defective device, if weak leakage current flows, then the leakage current makes a factor of dispersion of a device characteristic. Therefore, accurate photoelectric conversion or image pickup in accordance with incident light or incident energy cannot be achieved.

Therefore, it is desirable to provide a photoelectric conversion apparatus which can suppress leakage current between edges of semiconductor layers of the opposite conductivity types in a photoelectric conversion device and a radiographic imaging apparatus in which the photoelectric conversion apparatus is used.

SUMMARY

According to an embodiment of the present invention, there is provided:

A photodiode comprising:

a first semiconductor layer having a first conductivity type;

a second semiconductor layer having a second conductivity type that is opposite to the first conductivity type of the first semiconductor layer; and a third semiconductor layer interposed between the first semiconductor layer and the second semiconductor layer, wherein an edge of the first semiconductor layer is inset from an edge of the second semiconductor layer.

A photoelectric conversion apparatus comprising:

a pixel array section including a plurality of unit pixels each having a photodiode, the photodiodes including a first semiconductor layer having a first conductivity type;

a second semiconductor layer having a second conductivity type that is opposite to the first conductivity type of the first semiconductor layer; and a third semiconductor layer interposed between the first semiconductor layer and the second semiconductor layer, wherein an edge of the first semiconductor layer is inset from an edge of the second semiconductor layer.

A radiographic imaging apparatus comprising:

a wavelength conversion member for wavelength converting radioactive rays; and a photoelectric conversion apparatus configured to receive the converted radioactive rays from the wavelength conversion member, the photoelectric conversion apparatus including a pixel array section including a plurality of unit pixels each having a photodiode, the photodiodes including a first semiconductor layer having a first conductivity type;

a second semiconductor layer having a second conductivity type that is opposite to the first conductivity type of the first semiconductor layer; and a third semiconductor layer interposed between the first semiconductor layer and the second semiconductor layer, wherein an edge of the first semiconductor layer is inset from an edge of the second semiconductor layer.

In the photoelectric conversion apparatus and the radiographic imaging apparatus, the first semiconductor layer contacts with the third semiconductor layer through the contact hole formed in the insulation layer with an area smaller than that of the third semiconductor layer. Further, an edge of the first semiconductor layer contacting with the third semiconductor layer is positioned on the inner side with respect to an edge of the second semiconductor layer. Consequently, the distance between the edges of the first semiconductor layer and the second semiconductor layer becomes greater than that in an alternative case wherein the first and second semiconductor layers are formed in a substantially same shape. Accordingly, leakage current generated between the edges of the first and second semiconductor layers on the interface with the insulation layer can be suppressed in comparison with the alternative case wherein the first and second semiconductor layers are formed in a substantially same shape.

In summary, with the photoelectric conversion apparatus and the radiographic imaging apparatus, generation of leakage current between the edges of the opposite conductivity type semiconductor layers can be suppressed. Consequently, appearance of a device defect can be prevented and accurate photoelectric conversion corresponding to incident light or incident energy can be achieved.

The above and other features will become apparent from the following description and the appended claims, taken in conjunction with the accompanying drawings in which like parts or elements denoted by like reference symbols.

Additional features and advantages are described herein, and will be apparent from the following Detailed Description and the figures.

DETAILED DESCRIPTION

In the following, an embodiment f is described in detail with reference to the drawings. It is to be noted that the description is given in the following order.

1. Photoelectric Conversion Apparatus to Which an Embodiment of the Invention is Applied 2. Features of the Embodiment 2-1. Working Example 1 (example wherein a pixel separation structure is not adopted)

2-2. Working Example 2 (example wherein a pixel separation structure is adopted)

3. Modifications

<1. Photoelectric Conversion Apparatus to which an Embodiment is Applied>

System Configuration

Figure 1:
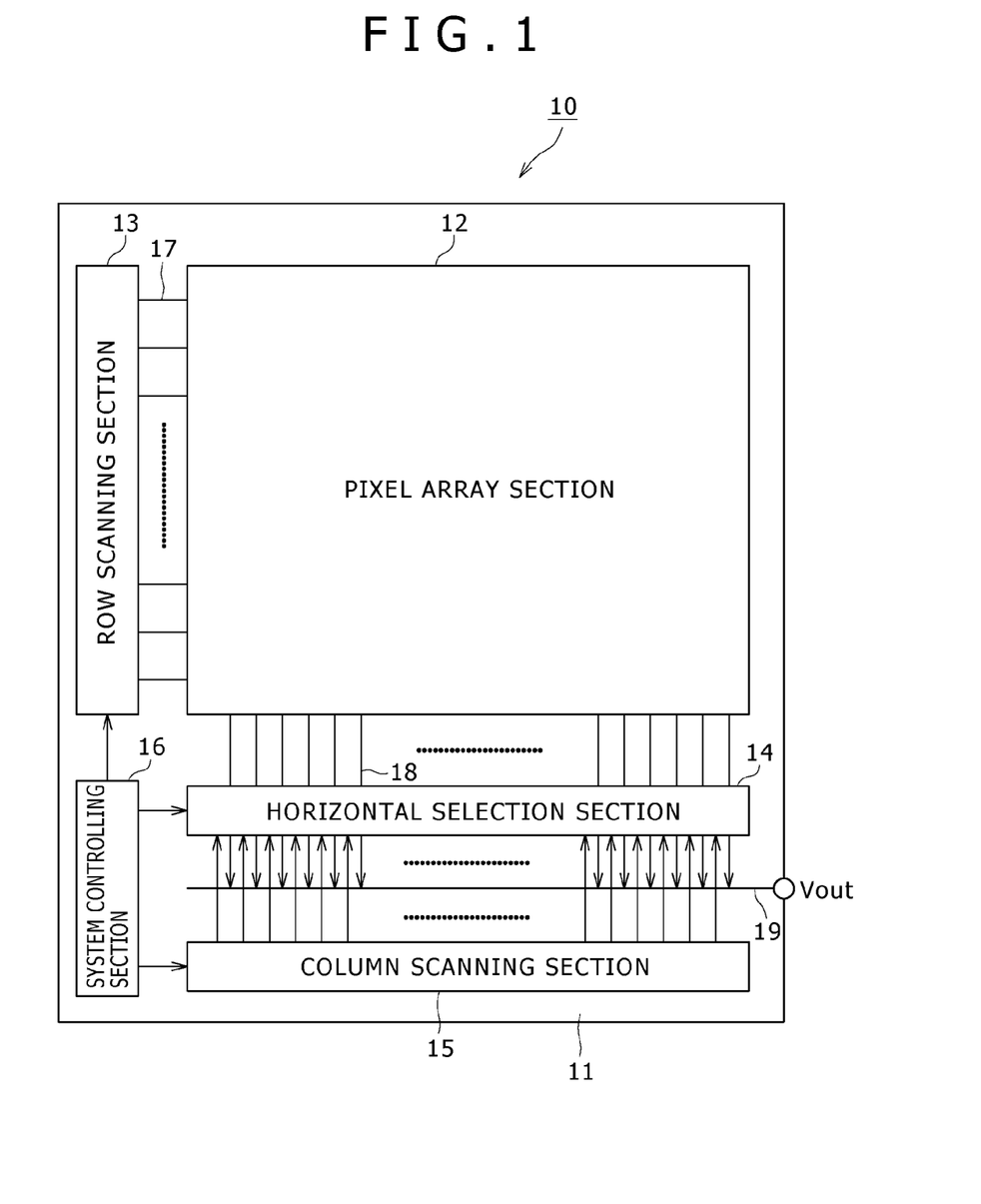
FIG. 1 is a block diagram schematically showing a system configuration of a photoelectric conversion apparatus in an embodiment.

FIG. 1 schematically shows a system configuration of a photoelectric conversion apparatus in an embodiment.

Referring to FIG. 1, the photoelectric conversion apparatus 10 shown includes a pixel array section 12 formed on an insulating substrate (hereinafter referred to sometimes simply as substrate) 11 such as a glass substrate and peripheral circuit sections integrated on the substrate 11 similarly to the pixel array section 12. In the present embodiment, as the peripheral circuit sections, for example, a row scanning section or vertical driving section 13, a horizontal selection section 14, a column scanning section or horizontal driving section 15 and a system controlling section 16 are provided.

Unit pixels (hereinafter referred sometimes simply as pixels) including a photoelectric conversion section or photoelectric conversion device for generating photocharge having a charge amount corresponding to the light amount of incident light and accumulating the generated photocharge therein are disposed two-dimensionally in a matrix, that is, in rows and columns, in the pixel array section 12. A particular configuration of the pixel units is hereinafter described.

Further in the pixel array section 12, a pixel driving line 17 is wired along a row direction, that is, along an array direction of pixels of a pixel row, for each of the pixel rows with respect to the pixel array arranged in rows and columns and a vertical signal line 18 is wired along a column direction, that is, along an array direction of pixels of a pixel column, for each of the pixel columns. The pixel driving line 17 transmits a driving signal for carrying out driving to read out a signal from a pixel. In FIG. 1, while the pixel driving line 17 is indicated as one wiring line, the number of such pixel driving lines is not limited to one. The pixel driving line 17 is connected at one terminal thereof to an output terminal corresponding to each row of the row scanning section 13.

The row scanning section 13 is configured from a shift resistor, an address decoder or the like and serves as a pixel driving section for driving the pixels of the pixel array section 12, for example, in a unit of a row. A signal outputted from each unit pixel of a pixel row selectively scanned by the row scanning section 13 is supplied to the horizontal selection section 14 through a vertical signal line 18 corresponding to the unit pixel. The horizontal selection section 14 is configured from an amplifier, a horizontal selection switch or the like provided for each vertical signal line 18.

The column scanning section 15 is configured from a shift resistor, an address decoder or the like and scans and drives the horizontal selection switches of the horizontal selection section 14 in order. By this selective scanning by the column scanning section 15, signals of the pixels transmitted through the vertical signal lines 18 are outputted in order to the horizontal signal line 19 and are transmitted to the outside of the substrate 11 through the horizontal signal line 19.

It is to be noted that the circuit section including the horizontal selection section 14, column scanning section 15 and horizontal signal line 19 is configured from a circuit formed on the insulating substrate 11 such as a glass substrate and/or an external controlling IC.

The system controlling section 16 receives a clock supplied from the outside of the substrate 11, data for the instruction of an operation mode and so forth, and outputs data such as inside information of the present photoelectric conversion apparatus 10 and so forth. Further, the system controlling section 16 includes a timing generator for generating various timing signals and carries out driving control of the peripheral circuit sections such as the row scanning section 13, horizontal selection section 14 and column scanning section 15 based on the various timing signals generated by the timing generator.

Pixel Configuration

Figure 2:
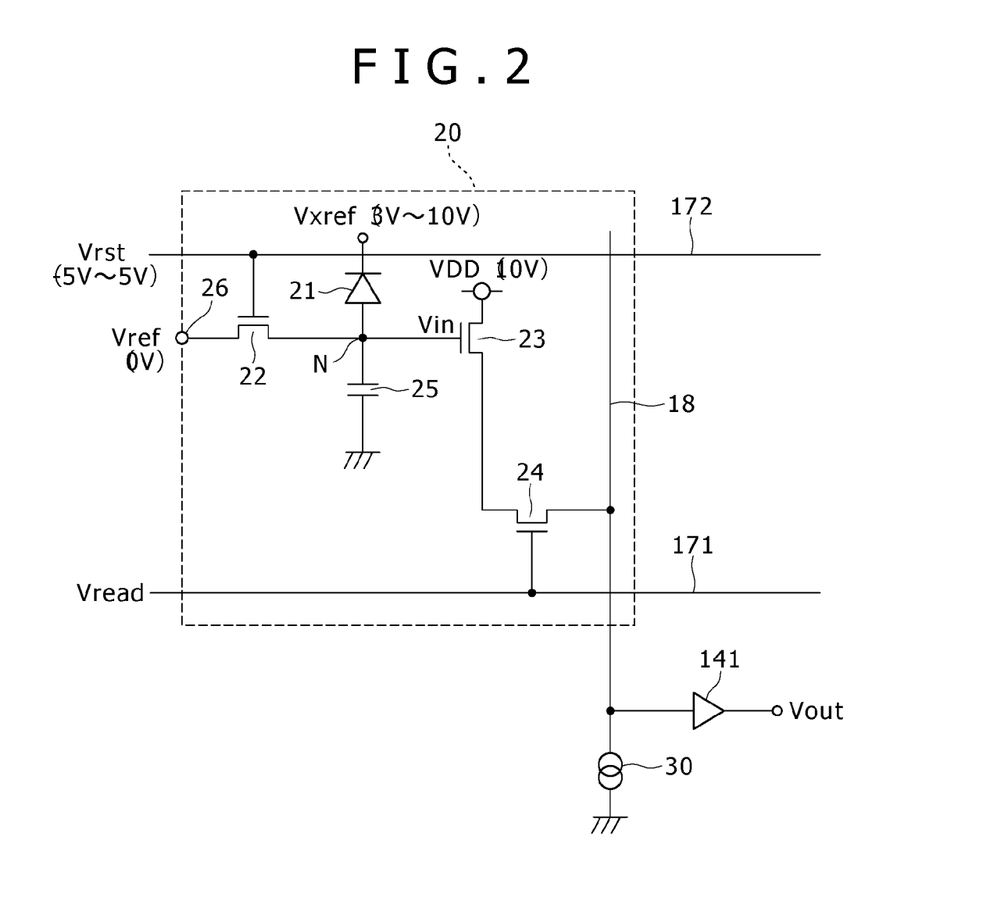
FIG. 2 is a circuit diagram showing an example of a circuit configuration of a unit pixel.

FIG. 2 shows an example of a circuit configuration of a unit pixel 20. Referring to FIG. 2, the unit pixel 20 shown includes a photoelectric conversion device 21, a reset transistor 22, a readout transistor 23 and a row selection transistor 24. In the unit pixel 20, for example, two wiring lines as pixel driving lines 17, particularly a row selection line 171 and a reset controlling line 172, are wired for each pixel row.

Here, an N-channel type field-effect transistor is used for the reset transistor 22, readout transistor 23 and row selection transistor 24. However, this combination of the conductivity types of the reset transistor 22, readout transistor 23 and row selection transistor 24 is merely an example.

The photoelectric conversion device 21 is, for example, a PIN (Positive Intrinsic Negative Diode) photodiode, and generates signal charge of a charge amount corresponding to a light amount of incident light by applying a standard potential Vxref of, for example, approximately 3 V to 10 V to the cathode. The anode of the photoelectric conversion device 21 is connected to an accumulation node N. A capacitance component 25 exists at the accumulation node N, and the signal charge generated by the photoelectric conversion device 21 is accumulated into the accumulation node N.

The reset transistor 22 is connected between a terminal 26 to which a reference potential Vref is supplied and the accumulation node N, and resets the potential of the accumulation node N to the reference potential Vref by switching on thereof in response to a reset signal Vrst having, for example, an amplitude of −5 V to 5 V.

The readout transistor 23 is connected at the gate and the drain thereof to the accumulation node N and a power supply VDD, respectively, and receives the signal charge generated by the photoelectric conversion device 21 at the gate thereof and then outputs a signal voltage in response to the signal charge.

The row selection transistor 24 is connected between the source of the readout transistor 23 and the vertical signal line 18, and outputs a signal outputted from the readout transistor 23 to the vertical signal line 18 by switching on thereof in response to a row scanning signal Vread. Regarding the row selection transistor 24, also a configuration can be applied wherein the row selection transistor 24 is connected between the drain of the readout transistor 23 and the power supply VDD.

A constant current source 30 is connected to one end of the vertical signal line 18. Here, a source follower circuit is formed from the readout transistor 23 and the constant current source 30 connected to the source of the readout transistor 23 through the row selection transistor 24 and the vertical signal line 18. With the source follower circuit, there is a merit that signal readout can be carried out at a high speed even where the capacitor to be formed on the vertical signal line 18 is great.

A signal read out by the readout transistor 23 for the source follower is inputted to an amplifier 141 which configures an inputting section of the horizontal selection section 14 for each pixel column through the vertical signal line 18.

Radiographic Imaging Apparatus

Figure 3:
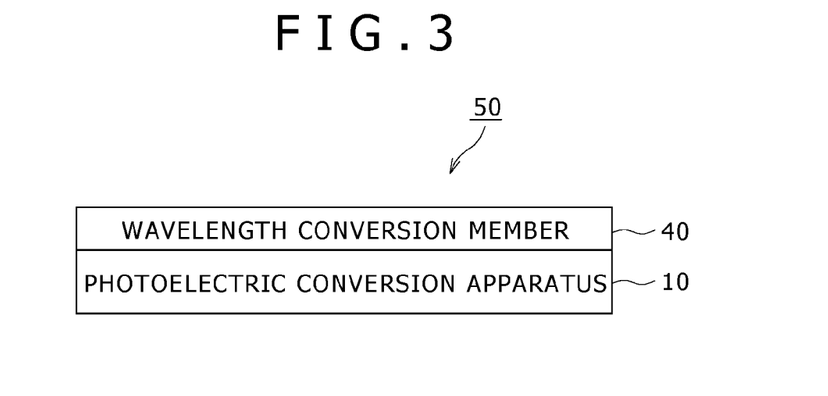
FIG. 3 is a schematic view showing a radiographic imaging apparatus configured from a combination of the photoelectric conversion apparatus and a wavelength conversion member.

In the photoelectric conversion apparatus 10 in which a plurality of unit pixels 20 having the configuration described above are disposed in rows and columns, a radiographic imaging apparatus for reading out information based on radioactive rays can be configured from a combination with a wavelength conversion member for wavelength converting radioactive rays represented by α-rays, β-rays, γ-rays and X-rays into rays of a wavelength in a sensitive range of the photoelectric conversion apparatus 10. In particular, as shown in FIG. 3, a radiographic imaging apparatus 50 can be configured by providing a wavelength conversion member 40 like a fluorescent material such as, for example, a scintillator on the light reception side of the pixel array section 12 of the photoelectric conversion apparatus 10.

<2. Features of the Embodiment>

In the photoelectric conversion apparatus 10 or the radiographic imaging apparatus 30 having the configuration described above according to the present embodiments, the photoelectric conversion device 21 is, for example, a PIN photodiode including a first semiconductor layer, a second semiconductor layer of the opposite conductivity type to that of the first semiconductor layer and a third semiconductor layer formed from a conductivity type intermediate between the conductivity types of the first and second semiconductor layers and interposed between the first and second semiconductor layers.

The photoelectric conversion device 21 includes an insulating layer formed between the first semiconductor layer and the third semiconductor layer and a contact hole formed therein with an area smaller than that of the second semiconductor layer, and has a structure wherein the first semiconductor layer and the third semiconductor layer contact with each other through the contact hole.

Since the first semiconductor layer and the third semiconductor layer contact with each other through the contact hole formed with an area smaller than that of the second semiconductor layer in this manner, an edge of the first semiconductor layer contacting with the third semiconductor layer is positioned on the inner side with respect to an edge of the second semiconductor layer. Consequently, the distance between the edges of the first semiconductor layer and the second semiconductor layer is greater than that in an alternative case wherein the first and second semiconductor layers are formed in a substantially same shape.

Accordingly, leakage current generated between the edges of the first and second semiconductor layers on the interface with the insulating layer is suppressed in comparison with an alternative case wherein the first and second semiconductor layers are formed in a substantially same shape. As a result, the photoelectric conversion device 21 such as a PIN photodiode or the like can be prevented from becoming a faulty device, and accurate photoelectric conversion in response to incident light or incident energy can be achieved.

Particular working examples of a pixel structure wherein leakage current generated between edges of the first and second semiconductor layers on the interface with the insulating layer can be suppressed are described below.

2-1. Working Example 1

Pixel Structure

Figure 4:
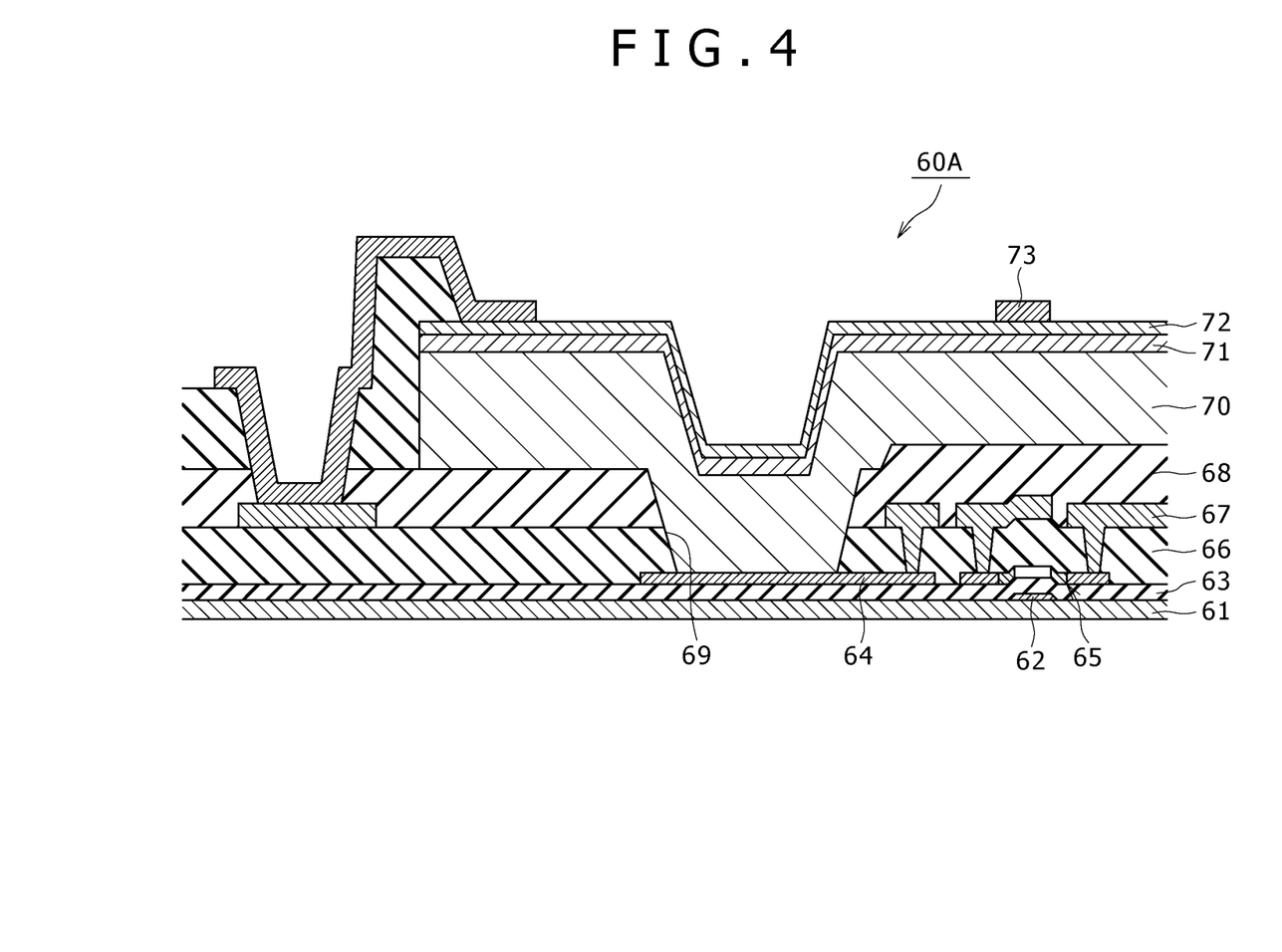
FIG. 4 is a partial sectional view showing a pixel structure according to a working example 1.

FIG. 4 is a partial sectional view showing a pixel structure according to a working example 1. Here, description is given taking a case wherein the photoelectric conversion device 21 is formed from a PIN photodiode as an example.

Referring to FIG. 4, a gate electrode 62 formed from Ti, Al, Mo, W, Cr or the like is formed on an insulating substrate 61 such as a glass substrate, and a gate insulating film 63 formed from SiNx, SiO2 or the like is formed on the gate electrode 62. On the gate insulating film 63, a first semiconductor layer of a PIN photodiode 60A according to the present working example 1, for example, a p-type semiconductor layer (p+ region) 64 is formed.

The p-type semiconductor layer 64 functions also as a lower electrode for reading out signal charge photoelectrically converted by the PIN photodiode 60. A semiconductor layer 65 of a pixel transistor such as the readout transistor 23 is further formed on the gate insulating film 63. In the semiconductor layer 65 of the pixel transistor, it is effective to form an LDD (Lightly Doped Drain) between the channel region and the source and drain region in order to reduce leakage current.

A first inter-layer insulating film 66 formed from SiNx, SiO2 or the like is formed on the first semiconductor layer 64 and the semiconductor layer 65 of the pixel transistor. Above the first inter-layer insulating film 66, a wiring line layer 67 including a signal line for readout and various wiring lines is formed from Ti, Al, Mo, W, Cr and so forth. A second inter-layer insulating film 68 formed from SiNx, SiO2, an organic insulating film or the like is formed on the wiring line layer 67.

A contact hole 69 is formed in the insulating layer formed from the first and second inter-layer insulating films 66 and 68. An i-type semiconductor layer 70 which is a third semiconductor layer formed from a conductivity type intermediate between the p-type and the n-type is formed on the second inter-layer insulating film 68 with an area greater than an opening area on the upper side of the contact hole 69. The i-type semiconductor layer 70 contacts with the p-type semiconductor layer 64 through the contact hole 69.

For example, the n-type semiconductor layer (n+ region) 71 which is the second semiconductor layer having a substantially same shape as that of the i-type semiconductor layer 70 is laminated on the i-type semiconductor layer 70. Further, a PIN photodiode 60A according to the present working example 1 is formed from the p-type semiconductor layer 64 which is the first semiconductor layer, i-type semiconductor layer 70 which is the third semiconductor layer and n-type semiconductor layer 71 which is the second semiconductor layer.

In the PIN photodiode 60A, amorphous silicon, microcrystalline silicon, polycrystalline silicon or the like can be used for the semiconductor layers 64, 70 and 71. Further, a material such as germanium, carbon or the like may be introduced into the silicon just described so that the spectral sensitivity is varied. Further, as the PIN photodiode 60A, a reverse direction configuration may be applied wherein the conductivity type on the lower side is the n-type and the conductivity type on the upper side is the p-type.

An upper electrode 72 for applying a prescribed voltage to the PIN photodiode 60A is formed on the n-type semiconductor layer 71 from a transparent conduction film of ITO (Indium Tin Oxide) or the like. Further, on the upper electrode 72, a power supply wiring line 73 for supplying a voltage to the upper electrode 72 is formed from a low-resistance material whose resistance is lower than that of the transparent conduction film of the upper electrode 72, that is, Ti, Al, Mo, W, Cr or the like. Such power supply wiring lines 73 are formed over the overall face of the pixel array section 12 in a mesh form, for example, so as to surround the unit pixel 20.

The photoelectric conversion device for collecting charge excited by incident light or incident energy, for example, the PIN photodiode 60A, is formed in such a manner as described above, and photoelectric conversion is carried out by applying a prescribed voltage through the power supply wiring line 73 and the upper electrode 72. The charge generated by the photoelectric conversion is collected using the p-type semiconductor layer 64 as the accumulation layer and is read out as current from the accumulation layer and then is applied to the gate of, for example, the source follower type readout transistor 23 shown in FIG. 2.

Radiation Detector

Further, though not shown, by disposing a fluorescent material so-called scintillator for converting radioactive rays such as X-rays or the like into visible radiation above the PIN photodiode 60A, a radioactive ray detector or radiation sensitometer sensitized by incident radioactive rays to generate signal charge can be configured. In particular, an organic flattening film or a flattening film formed from a spin-on-glass material is formed on the PIN photodiode 60A, and a fluorescent material is formed from CsI, NaI, CaF2 or the like on the portion on which the films are formed. If the radioactive ray detector is used in place of the PIN photodiode 60A, then the radiographic imaging apparatus 50 described above can be configured.

Working Effects

As described above, by applying the structure that the p-type semiconductor 64 and the i-type semiconductor layer 70 contact with each other through the contact hole 69 having an area, that is, an upper opening area, smaller than that of the n-type semiconductor layer 71 formed on the insulating layer (66, 68), such working effects as described below can be achieved. In particular, with the pixel structure, the p-type semiconductor layer 64 and the n-type semiconductor layer 71 are spatially spaced from each other and the edge of the p-type semiconductor layer 64 contacting with the i-type semiconductor layer 70, that is, the lower opening end of the contact hole 69, is positioned on the inner side with respect to the edge of the n-type semiconductor layer 71.

Consequently, the distance between the edge of the p-type semiconductor layer 64 contacting with the i-type semiconductor layer 70 and the edge of the n-type semiconductor layer 71 becomes greater than that in an alternative case wherein, as in the technique in related art, the p-type semiconductor layer 64 and the n-type semiconductor layer 71 are formed in the same shape with each other and the p-type semiconductor layer 64 and the i-type semiconductor layer 70 directly contact with each other. Accordingly, leakage current generated between the edges of the p-type semiconductor layer 64 and the n-type semiconductor layer 71 on the interface with the insulating layer (66, 68) can be suppressed in comparison with the case wherein the p-type semiconductor layer 64 and the n-type semiconductor layer 71 are formed in a substantially same shape as each other.

Here, as an example, where the size of the n-type semiconductor layer 71 is set approximately 50 to 100 µm, leakage current of approximately $10^{-10}$ A sometimes flows in the structure in related art in which the p-type semiconductor layer 64 and the n-type semiconductor layer 71 are formed in a substantially same shape as each other. On the other hand, the fact that, by positioning the edge of the p-type semiconductor layer 64 contacting with the i-type semiconductor layer 70 on the inner side by approximately 1 µm with respect to the edge of the n-type semiconductor layer 71, the leakage current can be reduced to approximately $10^{-14}$ A has been confirmed by a simulation by the present inventor.

Particularly where light is irradiated, it has been confirmed that the reduction effect of the leakage current is further remarkable. In particular, while the leakage current of approximately $10^{-7}$ A flows in the structure in related art wherein the p-type semiconductor layer 64 and the n-type semiconductor layer 71 are formed in a substantially same shape, it has been confirmed that, with the present pixel structure, the leakage current becomes $10^{-13}$ A or less.

It is to be noted that, in the working example 1, amorphous silicon, microcrystalline silicon and polycrystalline silicon can be used for the semiconductor layers 64, 70 and 71 of the PIN photodiode 60A. However, it is preferable to use amorphous silicon, microcrystalline silicon or a lamination film of amorphous silicon and microcrystalline silicon particularly for the i-type semiconductor layer 70.

Further, it is preferable to use polycrystalline silicon for the p-type semiconductor layer 64. Where amorphous silicon is used for the p-type semiconductor layer 64, a film having sufficiently low resistance cannot be obtained, and the dispersion increases in the pixel array section 12 also in a case wherein light having the same amount is irradiated. Accordingly, it is preferable to use not amorphous silicon but polycrystalline silicon for the p-type semiconductor layer 64.

Further, the p-type semiconductor layer 64 is provided on the accumulation layer side for collecting signal charge so that an after-image after reset operation by the reset transistor 22 (refer to FIG. 2) is reduced in comparison with an alternative case wherein the n-type semiconductor layer 71 is provided on the accumulation layer side. Not a little amount of charge is collected in the accumulation layer, that is, in the p-type semiconductor layer 64, by weak current flowing also after reset operation, and an image based on the current extracted from the accumulation layer in accordance with the charge becomes an after-image.

Figure 5:
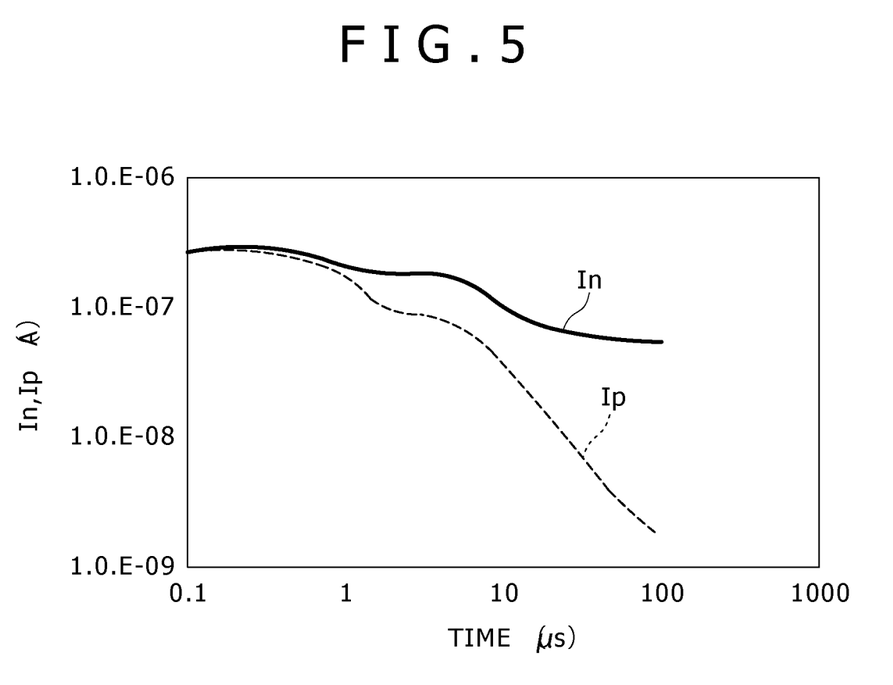
FIG. 5 is a graph illustrating a manner of variation with respect to time of p-side extraction current and n-side extraction current regarding an after-image after reset operation.

A manner of variation of p-side extraction current Ip and n-side extraction current Ip with respect to time regarding the after-image after reset operation is illustrated in FIG. 5. Here, the p-side extraction current Ip is current extracted from the accumulation layer where the p-type semiconductor layer 64 is provided on the accumulation layer side, and the n-side extraction current In is current extracted from the accumulation layer where the n-type semiconductor layer 71 is provided on the accumulation layer side.

It is recognized from FIG. 5 that the p-side extraction current Ip where the p-type semiconductor layer 64 is provided on the accumulation layer side decreases as time passes in comparison with the n-side extraction current In where the n-type semiconductor layer 71 is provided on the accumulation layer side. Therefore, the after-image after reset operation is reduced in the case wherein the p-type semiconductor layer 64 is provided on the accumulation layer side in comparison with the case wherein the n-type semiconductor layer 71 is provided on the accumulation layer side. Further, it has been confirmed that, regarding silicon used for the p-type semiconductor layer 64, the after-image reduces in order of polycrystalline silicon, microcrystalline silicon and amorphous silicon (polycrystalline silicon>microcrystalline silicon>amorphous silicon).

Figure 6:
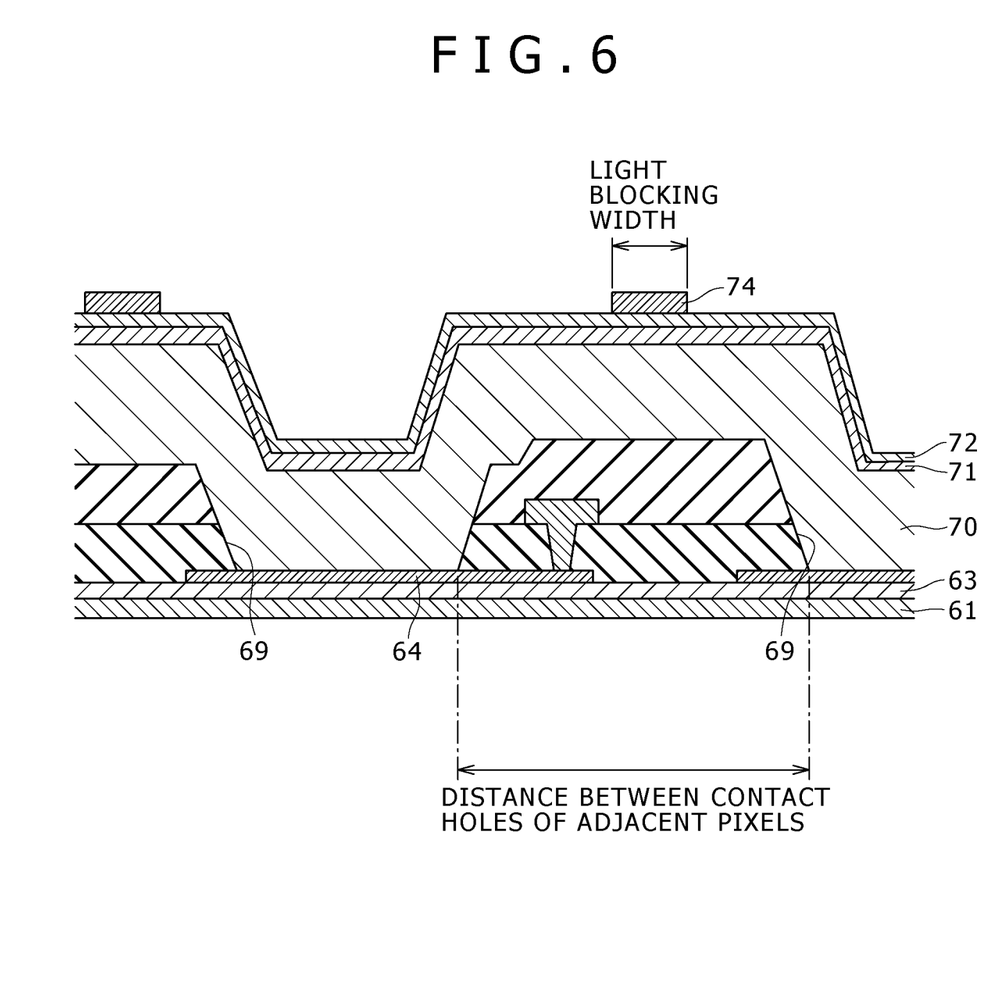
FIG. 6 is a partial sectional view showing a pixel structure where a light blocking layer is provided between adjacent unit pixels.

Further, in the pixel structure according to the present working example 1, the i-type semiconductor layer 70 and the n-type semiconductor layer 71 are formed continuing to the i-type semiconductor layer 70 and the n-type semiconductor layer 71 between the adjacent unit pixels 20, that is, between the adjacent PIN photodiodes 60A and without being separated between the pixels. While there is a merit that, by eliminating such separation between the pixels, a step for the separation can be eliminated, it is necessary to take a countermeasure for reducing crosstalk between the pixels. Here, the term crosstalk signifies that leakage current flows between the adjacent unit pixels 20.

Where the i-type semiconductor layer 70 is formed from amorphous silicon or microcrystalline silicon, the resistance value between the contact holes 69 of the adjacent PIN photodiodes 60A upon light irradiation is approximately $10^{-6}$ A. On the other hand, as shown in FIG. 6, by forming a light blocking layer 74 for blocking incident light or incident energy between the contact holes 69, the resistance at a portion at which light is blocked by the light blocking layer 74 increases, and therefore, the crosstalk between the pixels can be reduced.

Figure 7:
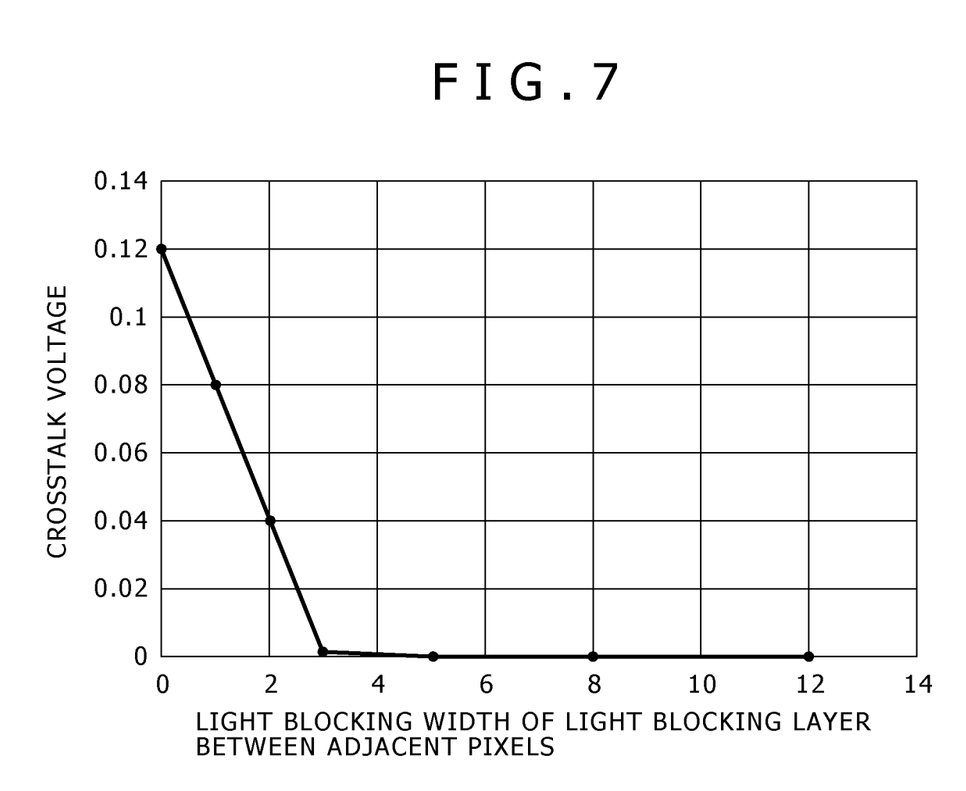
FIG. 7 is a graph illustrating a relationship between the light blocking width of the light blocking layer and a crosstalk voltage.

A relationship between the light blocking width of the light blocking layer 74 and the crosstalk voltage is illustrated in FIG. 7. As seen in FIG. 7, by setting the light blocking width of the light blocking layer 74 to 3 µm or more, the crosstalk between adjacent pixels, that is, between adjacent photodiodes, can be reduced sufficiently.

The light blocking layer 74 is formed over the overall face of the pixel array section 12 in a mesh form so as to surround the unit pixels 20. However, as occasion demands, it may be configured that light blocking is not applied between the pixels arranged in a direction orthogonal to the vertical signal line 18, that is, in a pixel array direction of a pixel row, for reading out a signal from the unit pixels 20 but light blocking is applied between the pixels arranged in an extension direction of the vertical signal line 18, that is, in a pixel array direction of a pixel column.

Here, the reset operation by the reset transistor 22 is successively carried out in a unit of a pixel row. Accordingly, a great potential difference is likely to appear between pixels in two pixel rows adjacent to each other including a pixel row after reset and another pixel row before reset. This signifies that the crosstalk is low between pixels in the two adjacent pixel rows in comparison with pixels in the same pixel rows.

Therefore, a pixel structure is applied wherein light blocking is not applied between pixels in a pixel array direction of a pixel row in which the crosstalk is low. Consequently, a maximum light reception area of the PIN photodiode 60A can be secured by an amount provided by not providing the light blocking layer 74 between pixels in a pixel array direction of a pixel row.

Further, also a configuration can be applied wherein the light blocking layer 74 functions also as the power supply wiring lines 73 formed, for example, in a mesh form over the overall face of the pixel array section 12 and electrically connected to the n-type semiconductor layer 71 and supplies a prescribed potential to the n-type semiconductor layer 71. The configuration just described is advantageous in that, by using the power supply wiring line 73 also as the light blocking layer 74 in this manner, a maximum light reception area of the PIN photodiode 60A can be secured by an amount by which the light blocking layer 74 is not provided.

It is to be noted that, while, in the working example 1, the device structure is presupposed wherein the p-type semiconductor layer 64 and the i-type semiconductor layer 70 contact with each other through the contact hole 69 (so as not to form the p-type semiconductor layer 64 on the side wall), the present invention can be applied to the device structure wherein the p-type semiconductor layer 64 and the i-type semiconductor layer 70 directly contact with each other (so as to form the p-type semiconductor layer 64 on the side wall of the contact hole 69). A PIN photodiode 60B according to this application is described below.

Figure 8:
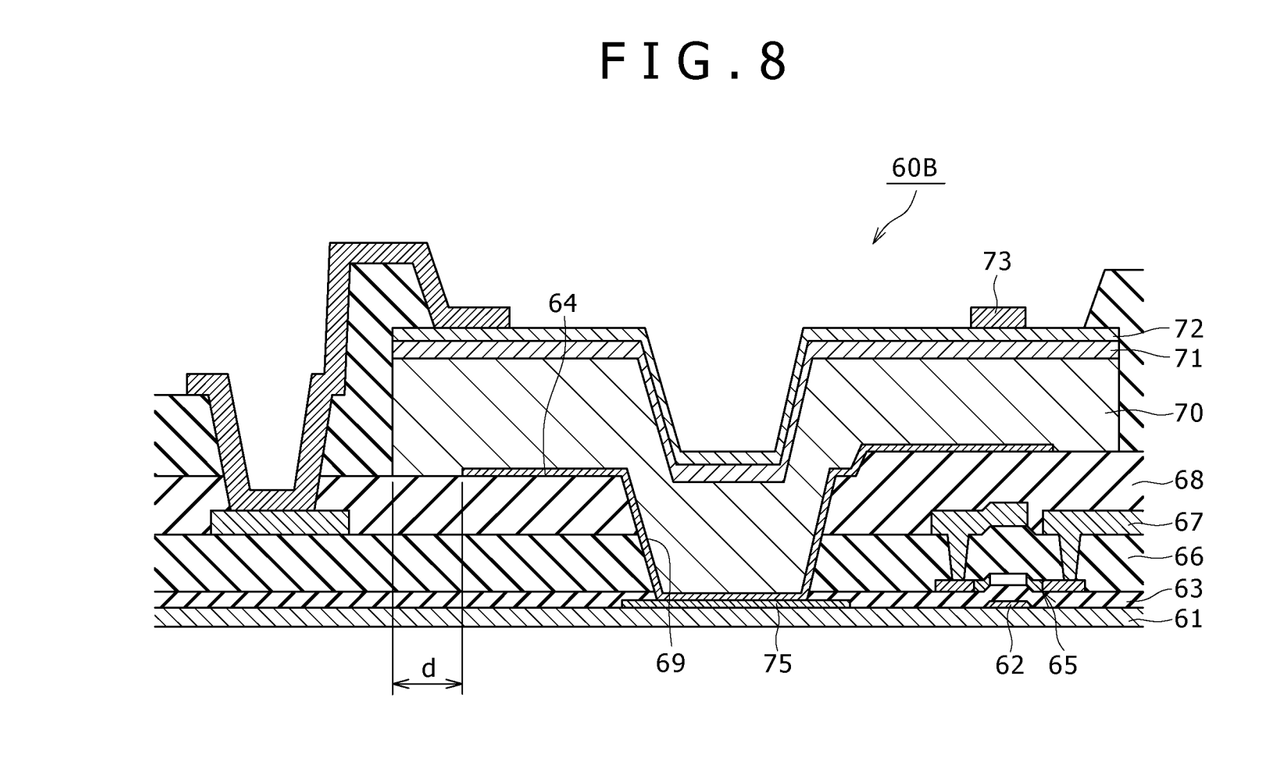
FIG. 8 is a partial sectional view showing a pixel structure where the present example is applied to a device structure wherein a p-type semiconductor layer and an i-type semiconductor layer directly contact with each other.

In particular, as shown in FIG. 8, in the PIN photodiode 60B having the device structure wherein the p-type semiconductor layer 64 and the i-type semiconductor layer 70 directly contact with each other, an edge of the p-type semiconductor layer 64 is formed so as to be placed on the inner side by a dimension d with respect to an edge of the n-type semiconductor layer 71. It is to be noted that, in the device structure, a lower electrode 75 is provided separately from the p-type semiconductor layer 64. Thus, charge accumulated using the p-type semiconductor layer 64 as an accumulation layer is read out as current through the lower electrode 75.

In this manner, also in the PIN photodiode 60B having the device structure wherein the p-type semiconductor layer 64 and the i-type semiconductor layer 70 directly contact with each other, by forming an edge of the p-type semiconductor layer 64 so as to be placed on the inner side with respect to an edge of the n-type semiconductor layer 71, the working effects similar to those of the working example 1 can be obtained. In particular, since the distance between the edges of the p-type semiconductor layer 64 and the n-type semiconductor layer 71 becomes greater than that in an alternative case wherein both semiconductor layers 64 and 71 are formed in a substantially same shape and the p-type semiconductor layer 64 and the i-type semiconductor layer 70 directly contact with each other as in the technique in related art, the leakage current can be suppressed.

2-2. Working Example 2

Figure 9:
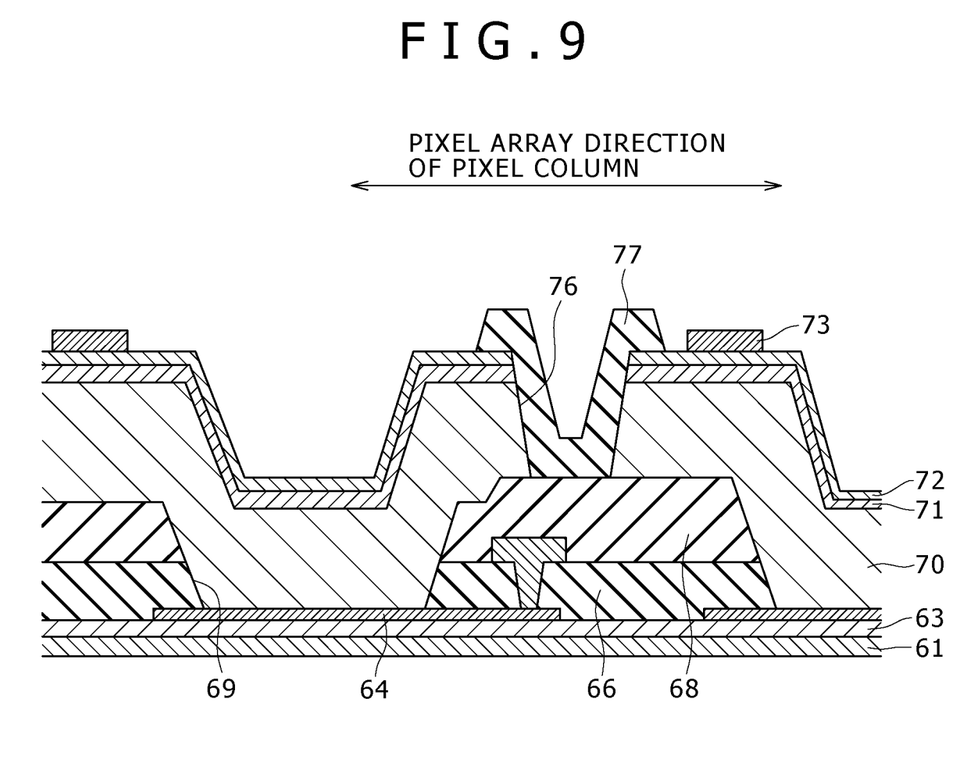
FIG. 9 is a partial sectional view showing a pixel structure according to a working example 2.

FIG. 9 is a partial sectional view showing a pixel structure according to a working example 2. In FIG. 9, like elements to those in FIG. 4 are denoted by like reference characters and overlapping description of them is omitted to avoid redundancy. Also in regard to the working example 2, description is given taking a case wherein the photoelectric conversion device 21 is formed from a PIN photodiode as an example.

In the pixel structure according to the working example 1, the i-type semiconductor layer 70 and the n-type semiconductor layer 71 do not separate from each other between the adjacent unit pixels 20. Further, by blocking incident light or incident energy by means of the light blocking layer 74 or the working line layer 73 formed over the overall face of the pixel array section 12 in a mesh form so as to surround the unit pixels 20, the crosstalk between the unit pixels 20 is suppressed.

As described hereinabove, since reset operation by the reset transistor 22 is carried out successively in a unit of a pixel row, a great potential difference is likely to appear between pixels in two adjacent pixel rows including a pixel row after reset and another pixel row before reset. As a result, the crosstalk is higher between pixels in the two adjacent pixel rows than that between pixels in the same pixel row. The pixel structure according to the present working example 2 is produced in this view of point.

In particular, in the pixel structure according to the present working example 2, a structure is applied wherein pixel separation is attempted between pixels in two adjacent pixel rows in which a great potential difference is likely to appear, that is, between pixels in a pixel array direction of a pixel column. In particular, as shown in FIG. 9, between pixels in a pixel array direction of a pixel column, a groove portion 76 extending to the second inter-layer insulating film 68 is formed along a pixel array direction of a pixel row in the i-type semiconductor layer 70 and the n-type semiconductor layer 71, and a third inter-layer insulating film 77 is formed in the groove portion 76. Then, the i-type semiconductor layer 70 and the n-type semiconductor layer 71 are separated between pixels by the third inter-layer insulating film 77, that is, by a pixel separation structure.

It is to be noted that, also in the present working example 2, the basic pixel structure wherein the contact hole 69 having an area smaller than that of the n-type semiconductor layer 71 is formed in the insulating layer (66, 68) and the p-type semiconductor layer 64 and the i-type semiconductor layer 70 contact with each other through the contact hole 69 is similar to that in the working example 1.

Working Effects

In this manner, the third inter-layer insulating film 77 is formed between pixels in the pixel array direction of a pixel column and the i-type semiconductor layer 70 and the n-type semiconductor layer 71 are separated between pixels by the inter-layer insulating film 77 so that the crosstalk between pixels in two adjacent pixel rows in which a great potential difference is likely to occur can be suppressed with certainty. Regarding the separation between pixels in the pixel array direction of a pixel row, as in the pixel structure of the working example 1, a light blocking structure may be applied wherein incident light or incident energy is blocked by the power supply wiring line 73 or the light blocking layer 74. Further, since the crosstalk between pixels in the same pixel row is lower than the crosstalk between pixels in the two adjacent pixel rows, also it is possible not to adopt the light blocking structure.

<3. Modifications>

While, in the embodiment described above, the configuration is applied wherein the peripheral circuit sections including the row scanning section 13 for driving pixels are provided on the substrate 11 similarly to the pixel array section 12, also a configuration can be applied wherein the peripheral circuit sections are provided outside the substrate 11.

However, if, for example, the configuration is applied wherein the row scanning section 13 is provided on the substrate 11, then an advantage can be obtained at a point described below. For example, since synchronization dispersion between driving ICs generated when timing control is carried out from a plurality of driving ICs provided outside the substrate 11 is not generated, the necessity for a synchronization controlling system between the driving ICs and adjustment working for the synchronization controlling system are eliminated. Further, since a work for connecting a plurality of driving ICs and the substrate 11 to each other is not required, significant reduction in cost can be implemented.

Further, the possibility of disconnection in a radiographic imaging apparatus of the handy type, disconnection by vibration upon movement or the like is reduced and the reliability can be enhanced significantly. Further, there is an advantage that, in comparison with an alternative case wherein a plurality of driving ICs and the substrate 11 are connected to each other by a flexible cable or the like, downsizing of the apparatus main body can be implemented and the degree of freedom of incorporation into a main body apparatus can be enhanced significantly.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A photodiode comprising:
a first semiconductor layer having a first conductivity type;
a second semiconductor layer having a second conductivity type that is opposite to the first conductivity type of the first semiconductor layer;
a first insulating film formed on end portions of the first semiconductor layer;
a wiring layer formed on the first insulating film, wherein the wiring layer includes a plurality of wiring lines;
a second insulating film formed on the wiring layer and the first insulating film;
a contact hole formed in the first and second insulating films exposing a portion of the first semiconductor layer; and
a third semiconductor layer interposed between the first semiconductor layer and the second semiconductor layer and formed on end portions of the first insulating film, on end portions and top portions of the second insulating film, and on the portion of the first semiconductor layer exposed by the contact hole such that the third semiconductor layer is in contact with the first semiconductor layer through the contact hole, wherein the second semiconductor layer is formed on the third semiconductor layer, the second semiconductor layer having a shape that is substantially the same as that of the third semiconductor layer, and wherein an edge of the first semiconductor layer in contact with the third semiconductor layer is inset with respect to an edge of the second semiconductor layer formed at an interface of the second semiconductor layer and a third insulating film.

2. The photodiode according to claim 1, wherein a portion of the first semiconductor layer functions as a lower electrode for reading out signal charge that is photoelectrically converted by the photodiode.

3. The photodiode according to claim 1, wherein the first semiconductor layer is formed at the same layer as a semiconductor layer of a field-effect transistor which receives a signal charge generated by the photodiode.

4. The photodiode according to claim 3, wherein the first semiconductor layer comprises polycrystalline silicon.

5. The photodiode according to claim 1, wherein the first semiconductor layer is formed on a gate insulating film.

6. The photodiode according to claim 1, wherein an edge of the first semiconductor layer formed at an interface of the first semiconductor layer and the first insulating film is inset from the edge of the second semiconductor layer formed at the interface of the second semiconductor layer and the third insulating film.

7. The photodiode according to claim 1, wherein a light blocking layer is formed over portions of the second semiconductor layer.

8. The photodiode according to claim 7, wherein the light blocking layer is electrically connected to the second semiconductor layer and also functions as a power supply wiring line for supplying a voltage to an electrode that is formed between the light blocking layer and the second semiconductor layer.

9. The photodiode according to claim 7, wherein the third semiconductor layer is formed as a continuous layer, and the light blocking layer is formed over a portion of the third semiconductor layer.

10. The photodiode according to claim 7, wherein light blocking is applied between pixels arranged in a first pixel array direction, but light blocking is not applied between pixels arranged in a second pixel array direction.

11. The photodiode according to claim 1, wherein a groove portion is formed through the second semiconductor layer and extends to the second insulating film.

12. A photoelectric conversion apparatus comprising:
a pixel array section including a plurality of unit pixels each having a photodiode including:
a first semiconductor layer having a first conductivity type;
a second semiconductor layer having a second conductivity type that is opposite to the first conductivity type of the first semiconductor layer;
a first insulating film formed on end portions of the first semiconductor layer;
a wiring layer formed on the first insulating film, wherein the wiring layer includes a plurality of wiring lines;
a second insulating film formed on the wiring layer and the first insulating film;
a contact hole formed in the first and second insulating films and exposing a portion of the first semiconductor layer; and
a third semiconductor layer interposed between the first semiconductor layer and the second semiconductor layer and formed on end portions of the first insulating film, on end portions and top portions of the second insulating film, and on the portion of the first semiconductor layer exposed by the contact hole such that the third semiconductor layer is in contact with the first semiconductor layer through the contact, wherein the second semiconductor layer is formed on the third semiconductor layer, the second semiconductor layer having a shape that is substantially the same as that of the third semiconductor layer, and wherein an edge of the first semiconductor layer in contact with the third semiconductor layer is inset with respect to an edge of the second semiconductor layer formed at an interface of the second semiconductor layer and a third insulating film.

13. The photoelectric conversion apparatus according to claim 12, wherein a portion of the first semiconductor layer functions as a lower electrode for reading out signal charge that is photoelectrically converted by the photodiode.

14. The photoelectric conversion apparatus according to claim 12, wherein the first semiconductor layer is formed at the same layer as a semiconductor layer of a field-effect transistor which receives a signal charge generated by the photodiode.

15. The photoelectric conversion apparatus according to claim 14, wherein the first semiconductor layer comprises polycrystalline silicon.

16. The photoelectric conversion apparatus according to claim 12, wherein the first semiconductor layer is formed on a gate insulating film.

17. The photoelectric conversion apparatus according to claim 12, wherein an edge of the first semiconductor layer formed at an interface of the first semiconductor layer and the first insulating film is inset from the edge of the second semiconductor layer formed at the interface of the second semiconductor layer and the third insulating film.

18. The photoelectric conversion apparatus according to claim 12, wherein a light blocking layer is formed over portions of the second semiconductor layer.

19. The photoelectric conversion apparatus according to claim 18, wherein the light blocking layer is electrically connected to the second semiconductor layer and also functions as a power supply wiring line for supplying a voltage to electrodes that are formed between the light blocking layers and the second semiconductor layers of respective unit pixels.

20. The photoelectric conversion apparatus according to claim 18, wherein the third semiconductor layer is formed as a continuous layer extending between adjacent unit pixels, and the light blocking layer is formed over portions of the third semiconductor layer.

21. The photoelectric conversion apparatus according to claim 18, wherein light blocking is applied between pixels arranged in a first pixel array direction, but light blocking is not applied between pixels arranged in a second pixel array direction.

22. The photoelectric conversion apparatus according to claim 12, wherein a plurality of groove portions are formed through the second semiconductor layer and extend to the second insulating film, and wherein interlayer insulating films are formed in the groove portions such that the interlayer insulating films separate the second semiconductor layers and the third semiconductor layers of adjacent unit pixels.

23. A radiographic imaging apparatus comprising:
a wavelength conversion member for wavelength converting radioactive rays; and
a photoelectric conversion apparatus configured to receive the converted radioactive rays from the wavelength conversion member, the photoelectric conversion apparatus including:
a pixel array section including a plurality of unit pixels each having a photodiode including:
a first semiconductor layer having a first conductivity type;
a second semiconductor layer having a second conductivity type that is opposite to the first conductivity type of the first semiconductor layer;
a first insulating film formed on end portions of the first semiconductor layer;
a wiring layer formed on the first insulating film, wherein the wiring layer includes a plurality of wiring lines;
a second insulating film formed on the wiring layer and the first insulating film;
a contact hole formed in the first and second insulating films and exposing a portion of the first semiconductor layer; and
a third semiconductor layer interposed between the first semiconductor layer and the second semiconductor layer and formed on end portions of the first insulating film, on end portions and top portions of the second insulating film, and on the portion of the first semiconductor layer exposed by the contact hole such that the third semiconductor layer is in contact with the first semiconductor layer through the contact hole, wherein the second semiconductor layer is formed on the third semiconductor layer, the second semiconductor layer having a shape that is substantially the same as that of the third semiconductor layer, and wherein an edge of the first semiconductor layer in contact with the third semiconductor layer is inset with respect to an edge of the second semiconductor layer formed at an interface of the second semiconductor layer and a third insulating film.

24. The radiographic imaging apparatus according to claim 23, wherein a portion of the first semiconductor layer functions as a lower electrode for reading out signal charge that is photoelectrically converted by the photodiode.

25. The radiographic imaging apparatus according to claim 23, wherein the first semiconductor layer is formed at the same layer as a semiconductor layer of a field-effect transistor which receives a signal charge generated by the photodiode.

26. The radiographic imaging apparatus according to claim 25, wherein the first semiconductor layer comprises polycrystalline silicon.

27. The radiographic imaging apparatus according to claim 23, wherein the first semiconductor layer is formed on a gate insulating film.

28. The radiographic imaging apparatus according to claim 23, wherein an edge of the first semiconductor layer formed at an interface of the first semiconductor layer and the first insulating film is inset from the edge of the second semiconductor layer formed at the interface of the second semiconductor layer and the third insulating film.

29. The radiographic imaging apparatus according to claim 23, wherein a light blocking layer is formed over portions of the second semiconductor layer.

30. The radiographic imaging apparatus according to claim 29, wherein the light blocking layer is electrically connected to the second semiconductor layer and also functions as a power supply wiring line for supplying a voltage to electrodes that are formed between the light blocking layers and the second semiconductor layers of respective unit pixels.

31. The radiographic imaging apparatus according to claim 29, wherein the third semiconductor layer is formed as a continuous layer extending between adjacent unit pixels, and the light blocking layer is formed over portions of the third semiconductor layer.

32. The radiographic imaging apparatus according to claim 29, wherein light blocking is applied between pixels arranged in a first pixel array direction, but light blocking is not applied between pixels arranged in a second pixel array direction.

33. The radiographic imaging apparatus according to claim 23, wherein a plurality of groove portions are formed through the second semiconductor layer and extend to the second insulating film, and wherein interlayer insulating films are formed in the groove portions such that the interlayer insulating films separate the second semiconductor layers and the third semiconductor layers of adjacent unit pixels.

* * * * *